(12) United States Patent
Chiu

(10) Patent No.: US 12,114,464 B2
(45) Date of Patent: Oct. 8, 2024

(54) LIQUID IMMERSION COOLER

(71) Applicant: TAIWAN MICROLOOPS CORP., New Taipei (TW)

(72) Inventor: Chun-Teng Chiu, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 323 days.

(21) Appl. No.: 17/725,169

(22) Filed: Apr. 20, 2022

(65) Prior Publication Data

US 2023/0345666 A1  Oct. 26, 2023

(51) Int. Cl.
*H02H 3/00* (2006.01)
*H05K 7/20* (2006.01)

(52) U.S. Cl.
CPC ..... *H05K 7/20236* (2013.01); *H05K 7/20263* (2013.01)

(58) Field of Classification Search
None
See application file for complete search history.

(56) References Cited

U.S. PATENT DOCUMENTS

| 2019/0246518 A1* | 8/2019 | Shen ........................ G06F 1/20 |
| 2022/0007542 A1* | 1/2022 | Jeong ................. H01L 23/3736 |
| 2023/0253288 A1* | 8/2023 | Adebiyi ............. H01L 25/0655 |
| | | 257/687 |

FOREIGN PATENT DOCUMENTS

| CN | 205789937 U | 12/2016 |
| JP | 2018046245 A | 3/2018 |
| TW | M299458 U | 10/2006 |
| TW | M631419 U | 9/2022 |

OTHER PUBLICATIONS

Office Action dated Dec. 6, 2022 of the corresponding Taiwan patent application No. 111111392.

* cited by examiner

*Primary Examiner* — Stephen W Jackson
(74) *Attorney, Agent, or Firm* — Chun-Ming Shih; HDLS IPR SERVICES

(57) ABSTRACT

A liquid immersion cooler includes a metal case, a soldering layer, a heat conduction layer, and a porous structure. The metal case has a heated surface and a cooling surface disposed on back of the heated surface. The soldering layer is laid on the cooling surface. The heat conduction layer is laid on the soldering layer. The porous structure is laid on the heat conduction layer. Therefore, the waste heat from an electronic heat source may be rapidly dissipated.

8 Claims, 3 Drawing Sheets

LIQUID IMMERSION COOLER

BACKGROUND

Technical Field

The disclosure relates to a cooler, particularly to a liquid immersion cooler.

Related Art

With the flourishing development and applications of the network technology, users have higher and higher requirements for the booting speed of computers, the reading speed of software and the playing speed of pictures and videos. Effectively saving time is one of the conditions for a customer to select a product.

With the increase of the performance and the reading speed, heat and temperature from electronic elements also continuously rise. High temperature not only makes aging of most components speed up, but also makes the reading and writing speed of an electronic element such as a hard disk drive slow down. Thus, how to keep the working temperature is an issue of the disclosure.

A cooler used for the electronic element includes a heat conduction plate and multiple fins on the heat conduction plate. The cooling effect can be implemented by the thermal contact between the heat conduction plate and the electronic element and air as a heat conduction medium. However, the thermal conductivity of air is too low to have good efficiency of heat conduction. Although there is a liquid immersion cooler in the market, the heat to be dissipated is limited by its structure, so current using demands cannot be satisfied.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

An object of the disclosure is to provide a liquid immersion cooler, which may rapidly dissipate the waste heat from an electronic heat source.

To accomplish the above object, the disclosure provides a liquid immersion cooler, which includes a metal case, a soldering layer, a heat conduction layer and a porous structure. The metal case has a heated surface and a cooling surface disposed on back of the heated surface. The soldering layer is laid on the cooling surface. The heat conduction layer is laid on the soldering layer. The porous structure is laid on the heat conduction layer.

The disclosure further has the following functions. By the arrangement of the heat conduction layer, pores of the porous structure may not be jammed by soldering material in the manufacturing process. By the pores being limited in a specific range, there is much more cooling surface area in the same unit area, and the liquid may easily penetrate in or out to flow.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
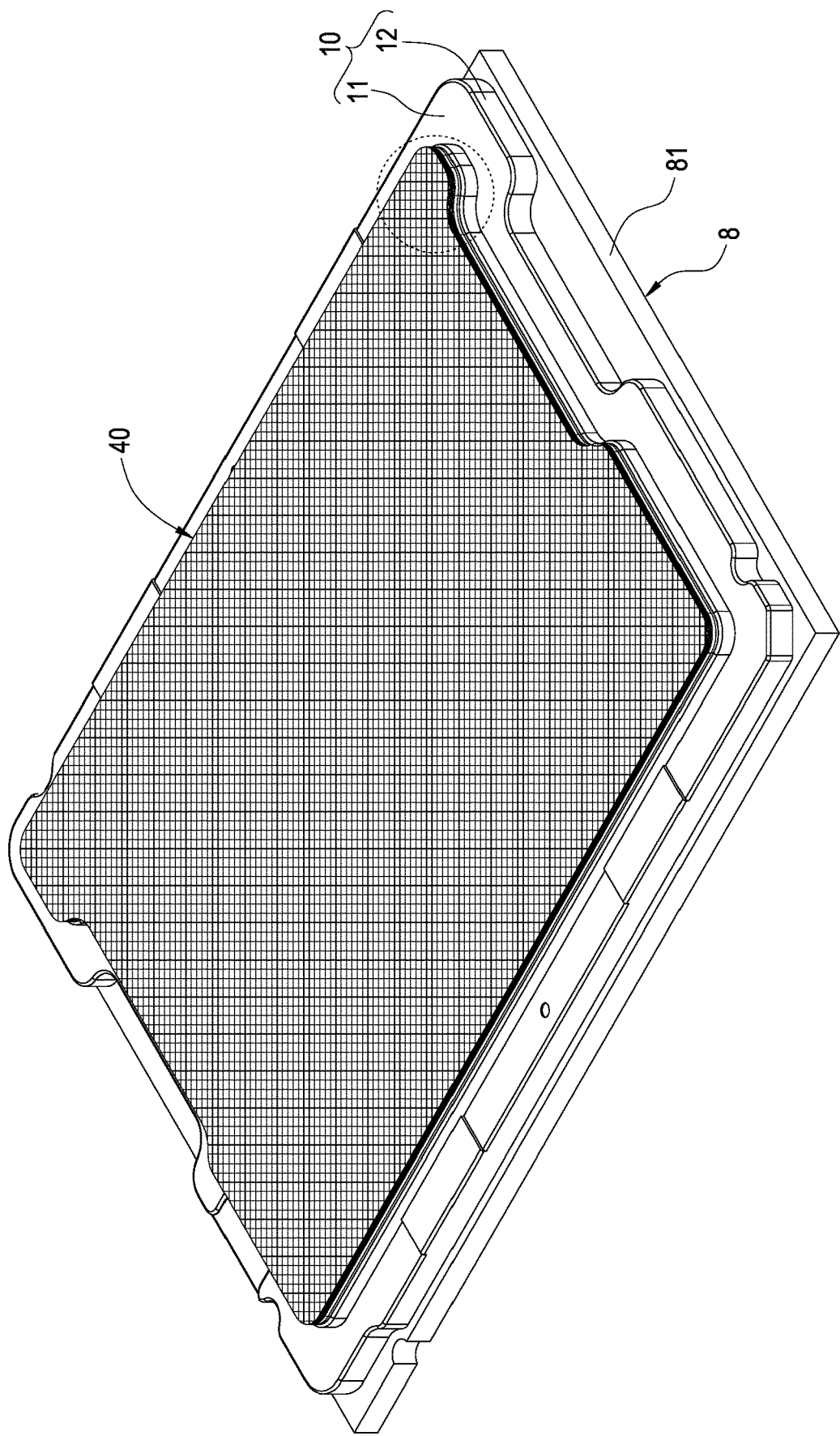
FIG. 1 is a schematic assembled view of the liquid immersion cooler of the disclosure and an electronic element.
Figure 2:
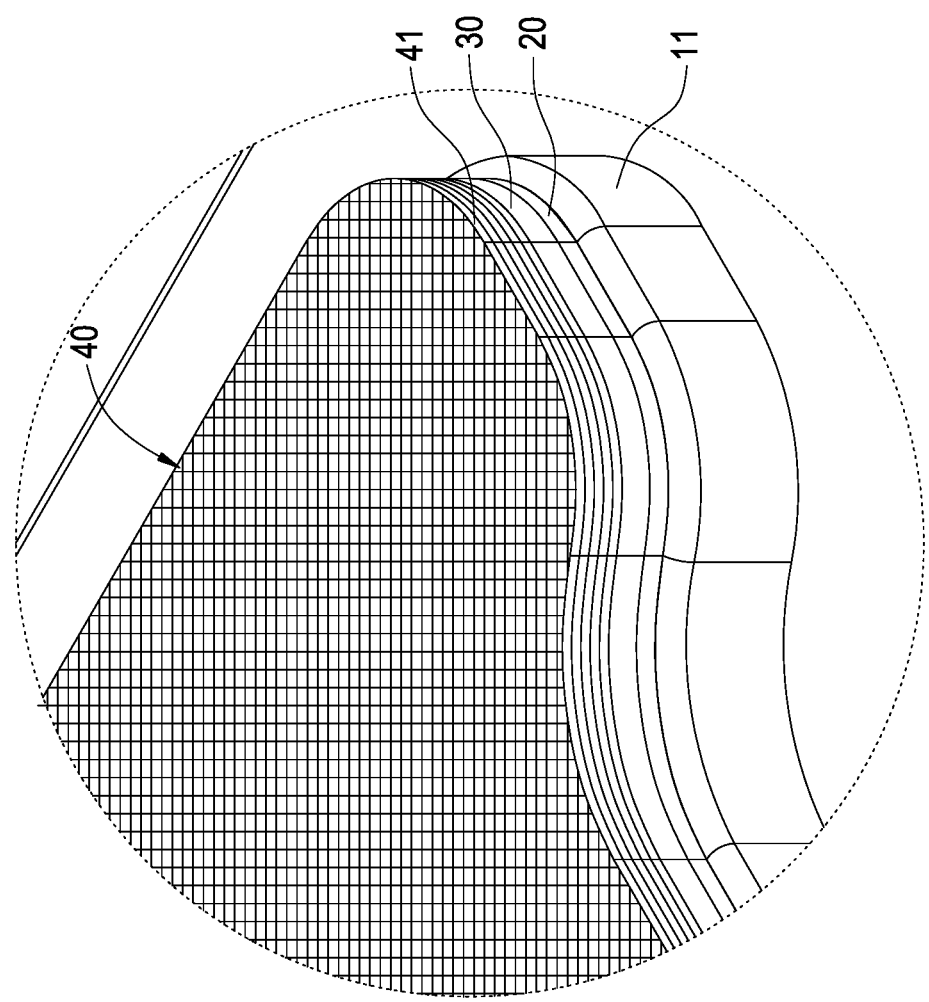
FIG. 2 is a partially enlarged view of FIG. 1.
Figure 3:
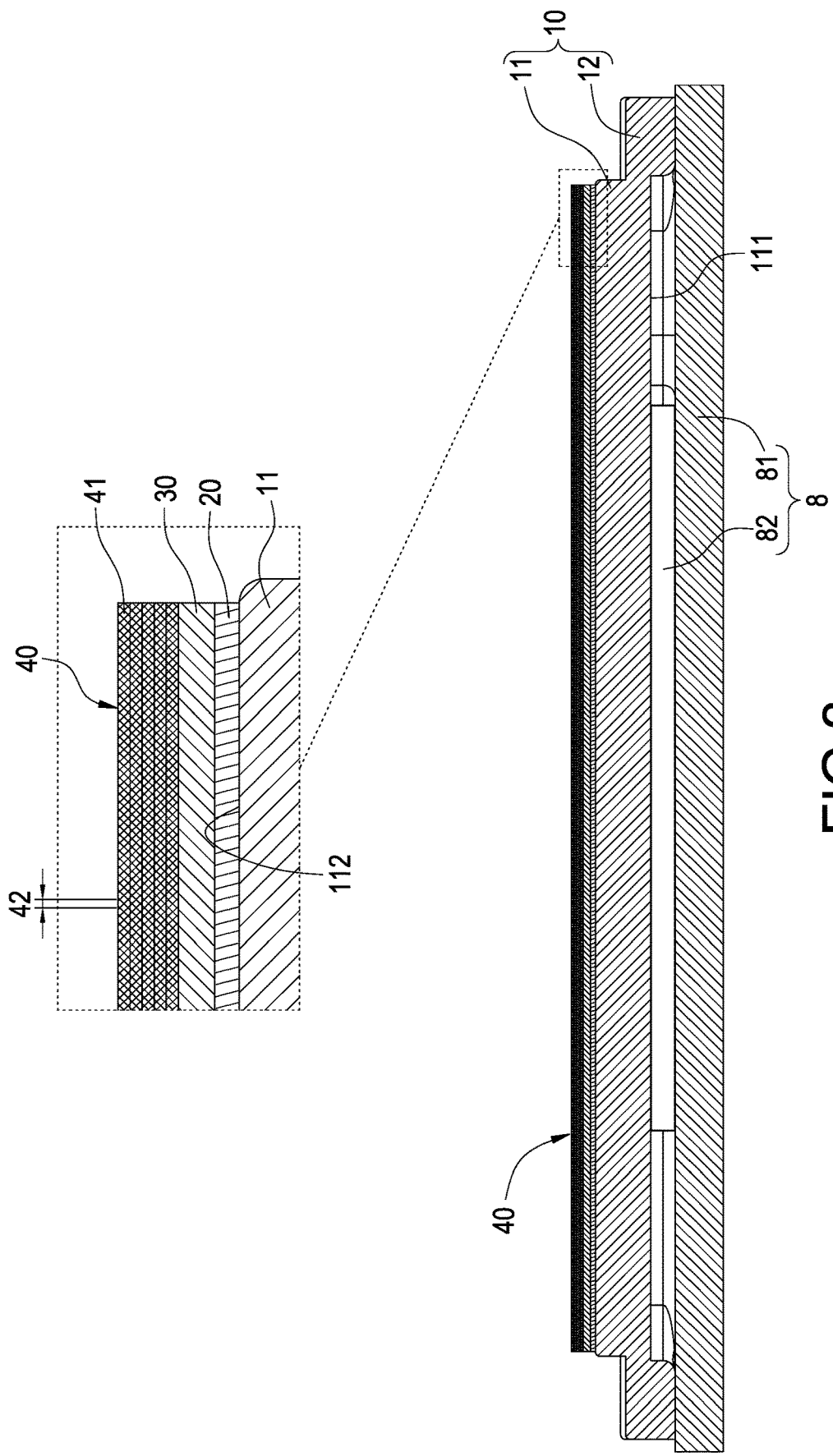
FIG. 3 is an assembled cross-sectional view of the liquid immersion cooler of the disclosure and an electronic element.

Please refer to FIGS. 1-3. The disclosure provides a liquid immersion cooler, which includes a metal case 10, a soldering layer 20, a heat conduction layer 30 and a porous structure 40.

The metal case 10 is made of copper, aluminum, magnesium, or an alloy thereof and includes a substrate 11 and multiple side plates 12 downward extended from a periphery of the substrate 11. A lower surface of the substrate 11 has a heated surface 111. An upper surface of the substrate 11 has a cooling surface 112 which is formed on the back of the heated surface 111.

The soldering layer 20 is laid on the cooling surface 112. In an embodiment, the soldering layer 20 may be solder paste such as Sn42Bi58, which has a melting temperature of about 138° C., a thickness of less than or equal to about 0.05 millimeters (mm), and a thermal conductivity of 19 W/mk.

The heat conduction layer 30 is laid on the soldering layer 20. In an embodiment, the heat conduction layer 30 may be C1100 copper foil, which has a thickness of less than or equal to about 0.5 millimeters (mm) and a thermal conductivity of greater than or equal to 390 W/mk.

The porous structure 40 is laid on the heat conduction layer 30. The porous structure 40 may be a woven metal mesh such as a copper mesh with mesh value greater than or equal to 65 (that is, the gap is less than or equal to about 0.2 mm). In some embodiments, a mesh value is between 120 and 300. The woven metal mesh is connected to the heat conduction layer 30 in a diffusion bonding manner.

In some embodiments, the woven metal mesh includes multiple mesh units 41. The mesh units 41 are stacked layer by layer to be laid and assembled on the cooling surface 112. Each woven mesh unit 41 may be made of C1100 copper mesh, with wire diameter being about 0.05 millimeter (mm), thickness being about 0.1 millimeter (mm), porosity being 50%, and thermal conductivity being greater than or equal to 390 W/mk.

Please refer to FIG. 3. The liquid immersion cooler of the disclosure may be applied to any electronic element 8. The electronic element 8 includes a circuit board 81 and an electronic heat source 82 disposed on the circuit board 81. When assembling, the metal case covers on the electronic heat source 82, each side plate 12 abuts against the circuit board 81, and a top surface of the electronic heat source 82 abuts against the heated surface 111 or a heat conduction medium (not shown in figures) is filled between the electronic heat source 82 and the heated surface 111.

When using, the abovementioned structure is placed in a liquid container (not shown in figures). The liquid in the liquid container is non-conductive liquid with a low boiling point. When the waste heat from the working electronic heat source 82 is directly conducted to the cooling surface 112, the heat conduction layer 30 and the porous structure 40 through the heated surface 111, the waste heat is rapidly dissipated by the non-conductive liquid flowing through the heat conduction layer 30 and the pores 42 of each mesh unit 41.

While this disclosure has been described by means of specific embodiments, numerous modifications and variations could be made thereto by those skilled in the art without departing from the scope and spirit of this disclosure set forth in the claims.

What is claimed is:

1. A liquid immersion cooler comprising:
    a metal case, comprising a heated surface and a cooling surface disposed on back of the heated surface;
    a soldering layer, laid on the cooling surface;
    a heat conduction layer, laid on the soldering layer; and
    a porous structure, laid on the heat conduction layer,
    wherein the porous structure is a woven metal mesh;
    wherein a mesh value of the woven metal mesh is greater than or equal to 65.

2. The liquid immersion cooler of claim 1, wherein the mesh value of the woven metal mesh is between 120 and 300.

3. The liquid immersion cooler of claim 1, wherein the woven metal mesh is a copper mesh.

4. A liquid immersion cooler comprising:
    a metal case, comprising a heated surface and a cooling surface disposed on back of the heated surface;
    a soldering layer, laid on the cooling surface;
    a heat conduction layer, laid on the soldering layer; and
    a porous structure, laid on the heat conduction layer,
    wherein the porous structure is a woven metal mesh;
    wherein the woven metal mesh comprises multiple mesh units stacked with each other.

5. A liquid immersion cooler comprising:
    a metal case, comprising a heated surface and a cooling surface disposed on back of the heated surface;
    a soldering layer, laid on the cooling surface;
    a heat conduction layer, laid on the soldering layer; and
    a porous structure, laid on the heat conduction layer
    wherein the porous structure is a woven metal mesh;
    wherein the woven metal mesh is connected to the heat conduction layer in a diffusion bonding manner.

6. The liquid immersion cooler of claim 1, wherein the soldering layer comprises a solder paste.

7. The liquid immersion cooler of claim 1, wherein the heat conduction layer comprises a copper foil.

8. The liquid immersion cooler of claim 1, wherein the metal case comprises a substrate and multiple side plates downward extended from a periphery of the substrate, the heated surface is disposed on a lower surface of the substrate, and the cooling surface is disposed on an upper surface of the substrate.

* * * * *